(12) United States Patent
Yoshimura et al.

(10) Patent No.: US 9,543,227 B2
(45) Date of Patent: Jan. 10, 2017

(54) SEMICONDUCTOR DEVICE

(71) Applicant: Mitsubishi Electric Corporation, Tokyo (JP)

(72) Inventors: Koichi Yoshimura, Fukuoka (JP); Kazuhiro Kurachi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/023,870

(22) PCT Filed: Dec. 27, 2013

(86) PCT No.: PCT/JP2013/085148
§ 371 (c)(1),
(2) Date: Mar. 22, 2016

(87) PCT Pub. No.: WO2015/097874
PCT Pub. Date: Jul. 2, 2015

(65) Prior Publication Data
US 2016/0240456 A1    Aug. 18, 2016

(51) Int. Cl.
*H01L 23/36* (2006.01)
*H01L 23/40* (2006.01)
(Continued)

(52) U.S. Cl.
CPC ........... *H01L 23/4006* (2013.01); *H01L 23/36* (2013.01); *H01L 23/367* (2013.01);
(Continued)

(58) Field of Classification Search
CPC .................. H01L 34/34–34/473; H01L 34/46; H01L 34/4043; H01L 34/405; H01L 34/4275; H01L 34/367–34/3677; H01L 34/3736–34/3738; H01L 34/743; H01L 34/42;H01L 34/3672; H01L 34/4006; H01L 34/4068; H01L 34/4087
See application file for complete search history.

(56) References Cited

U.S. PATENT DOCUMENTS 5,793,106 A * 8/1998 Yasukawa ........... H01L 23/3121
257/706
2009/0200065 A1* 8/2009 Otoshi .................. H01L 23/367
174/252
(Continued)

FOREIGN PATENT DOCUMENTS

JP    2003-168772 A    6/2003
JP    2003168772 A *   6/2003
(Continued)

OTHER PUBLICATIONS

International Search Report, PCT/JP2013/085148 mailed Apr. 10, 2014.
(Continued)

*Primary Examiner* — Marvin Payen
*Assistant Examiner* — Jeremy Joy
(74) *Attorney, Agent, or Firm* — Studebaker & Brackett PC

(57) ABSTRACT

A semiconductor device (10) includes a metallic base plate (22) provided with an upper surface (22a) and a lower surface (22b), a plurality of insulating substrates (24) provided on the upper surface (22a), and a plurality of semiconductor elements (26) and (28) mounted side by side on the respective insulating substrates (24). Annular grooves (50) and (52) for storing insulating grease are provided on the lower surface (22b) of the base plate (22). A surface (40a) of a cooling fin (40) is superimposed on the lower surface (22b) with insulating grease (42) interposed therebetween and insides of the annular grooves (50) and (52) are filled with the insulating grease (42).

3 Claims, 9 Drawing Sheets

(51) Int. Cl.
*H01L 23/367* (2006.01)
*H01L 23/34* (2006.01)
*H01L 23/473* (2006.01)
*H01L 23/373* (2006.01)
*H01L 23/42* (2006.01)
*H01L 25/07* (2006.01)
*H01L 25/18* (2006.01)
*H01L 23/498* (2006.01)
*H01L 29/16* (2006.01)
*H01L 29/739* (2006.01)
*H01L 29/861* (2006.01)

(52) U.S. Cl.
CPC ...... *H01L 23/3672* (2013.01); *H01L 23/3735* (2013.01); *H01L 23/42* (2013.01); *H01L 23/49844* (2013.01); *H01L 25/07* (2013.01); *H01L 25/072* (2013.01); *H01L 25/18* (2013.01); *H01L 29/1608* (2013.01); *H01L 29/7393* (2013.01); *H01L 29/861* (2013.01); H01L 2023/405 (2013.01); H01L 2023/4031 (2013.01); H01L 2023/4068 (2013.01); H01L 2023/4087 (2013.01); H01L 2924/0002 (2013.01)

(56) References Cited

U.S. PATENT DOCUMENTS

2010/0101762 A1* 4/2010 Kroliczek ............. F28D 15/043 165/104.26
2011/0180809 A1 7/2011 Hino et al.
2012/0001318 A1* 1/2012 Mamitsu ............. H01L 23/4334 257/713
2012/0091573 A1* 4/2012 Sasaki ................. H01L 23/3107 257/717
2013/0264702 A1* 10/2013 Nishi ..................... H01L 23/36 257/712

FOREIGN PATENT DOCUMENTS

| JP | 2003-243584 A | | 8/2003 |
| JP | 2003243584 A | * | 8/2003 |
| JP | 2006-196576 A | | 7/2006 |
| JP | 2006196576 A | * | 7/2006 |
| JP | 2007-096191 A | | 4/2007 |
| JP | 2007096191 A | * | 4/2007 |
| JP | 2008-004745 A | | 1/2008 |
| JP | 2010-092999 A | | 4/2010 |
| JP | 2010-283222 A | | 12/2010 |
| JP | 2011-155088 A | | 8/2011 |

OTHER PUBLICATIONS

Notification of Transmittal of Copies of Translation of the International Preliminary Report on Patentability and Translation of Written Opinion of the International Searching Authority; PCT/JP2013/085148 issued on Jul. 7, 2016.

* cited by examiner

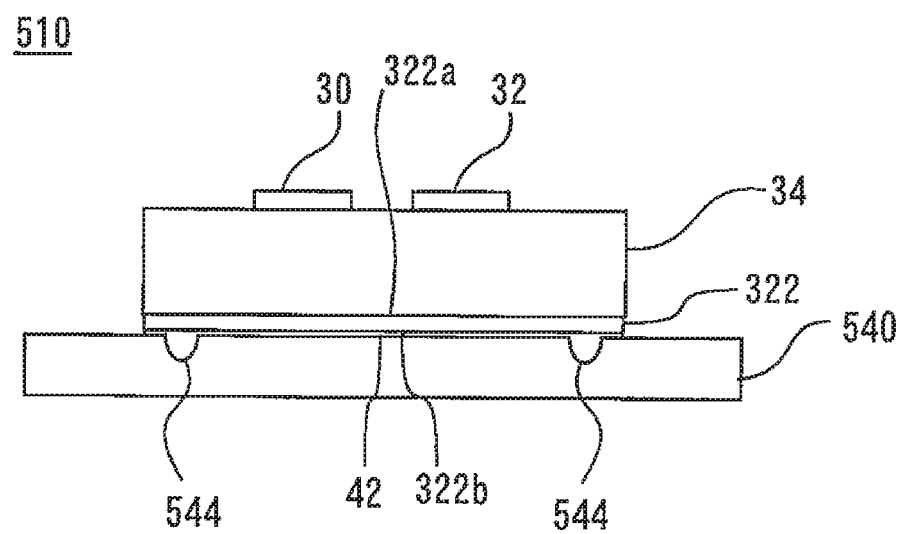
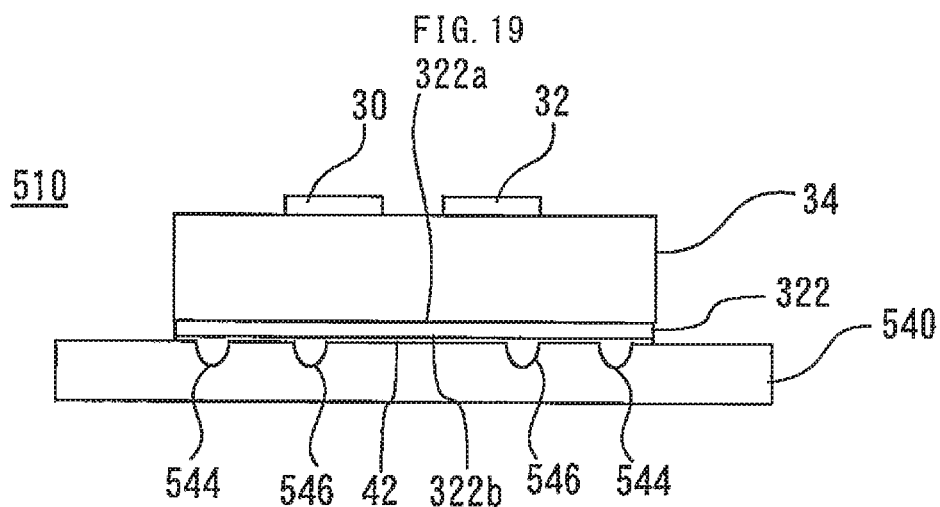

SEMICONDUCTOR DEVICE

TECHNICAL FIELD

The present invention relates to a semiconductor device.

BACKGROUND ART

Conventionally, as disclosed in, for example, Japanese Patent Application Laid-Open No. 2003-168772, semiconductor devices are known which are each provided with a groove portion or the like for preventing grease from spreading between a base plate and a cooling fin. Generally, thermal conductive grease is applied to a lower surface of a base plate of a power module, and the base plate and the cooling fin are fixed by screws via the grease. When fixed by screws, these parts are pressurized so that the cooling fin and the grease conform to each other, and further clamped and fixed by screws, and therefore the grease spreads in a surface direction of the base plate during fixing. According to the above-described prior art, a grease diffusion preventing portion is provided on at least one of opposing surfaces of the base plate and the cooling fin to avoid the grease from infiltrating into screw holes and this grease diffusion preventing portion can be a groove portion or a protruding portion.

CITATION LIST

Patent Literature

Patent Literature 1: Japanese Patent Application Laid-Open No. 2003-168772
Patent Literature 2: Japanese Patent Application Laid-Open No. 2006-196576
Patent Literature 3: Japanese Patent Application Laid-Open No. 2010-92999
Patent Literature 4: Japanese Patent Application Laid-Open No. 2010-283222
Patent Literature 5: Japanese Patent Application Laid-Open No. 2008-4745

SUMMARY OF INVENTION

Technical Problem

With a semiconductor device with a specification according to which a power module is provided with a metallic base plate, a semiconductor element in the power module generates heat when power is turned on and the base plate expands, while when power is off, its temperature decreases, causing the base plate to contract. Alternating heat generation and cooling every time the power to the semiconductor element is turned on or off causes the grease applied between the base plate and the cooling fin to gradually stick out of the edge of the base plate. As a result, the amount of insulating grease between the base plate and the cooling fin decreases from an initial state, resulting in a problem that cooling performance deteriorates. The above-described prior art is intended to prevent the grease from infiltrating into the screw holes, but has not considered how to maintain the amount of grease.

The present invention has been implemented to solve the above-described problems and it is an object of the present invention to provide a semiconductor device capable of keeping an appropriate amount of grease and obtaining stable cooling performance.

Means for Solving the Problems

A semiconductor device according to the first invention includes a base plate having an upper surface and a lower surface; and a plurality of planar semiconductor elements provided side by side on the upper surface side, wherein grooves are provided on the lower surface of the base plate, which separately surround the plurality of semiconductor elements one by one on the upper surface side in a plan view of the base plate.

A semiconductor device according to the second invention includes a base plate having an upper surface and a lower surface; and a semiconductor element provided on the upper surface side, wherein a groove is provided on the lower surface of the base plate, which surround the semiconductor element on the upper surface side in a plan view of the base plate, and a cross-sectional shape of the groove is a first cross-sectional shape including a first portion that is opened toward the lower surface side at a first width and a second portion that is connected to the first portion, located closer to the upper surface side than the first portion and has a greater width than the first portion, or a second cross-sectional shape comprising two sides, a width of which increases as a distance from the lower surface side decreases, the two sides forming a curve which is convex toward the inside of the grooves.

A semiconductor device according to the third invention includes a base plate having an upper surface and a lower surface; and a plurality of planar semiconductor elements provided side by side on the upper surface side, wherein the lower surface of the base plate is provided with a groove region where a plurality of grooves are continuously provided so as to spread and overlap with the plurality of semiconductor elements, grooves of the groove region in the center of the base plate are deeper than grooves of the groove region on distal end sides of the base plate.

A semiconductor device according to the fourth invention includes a base plate having an upper surface and a lower surface; planar semiconductor elements provided side by side on the upper surface side; and a cooling fin having a flat surface, the flat surface being superimposed on the lower surface, wherein the flat surface is provided with an annular groove having a smaller outline than the base plate in a plan view.

Advantageous Effects of Invention

According to the first invention, the grooves are provided on the lower surface of the base plate so as to be able to keep the amount of grease below each one of the plurality of semiconductor elements, and it is therefore possible to obtain stable cooling performance.

According to the second invention, the groove having a special shape is provided on the lower surface of the base plate so as to be able to reliably keep the amount of grease, and it is therefore possible to obtain stable cooling performance.

According to the third invention, the groove region having an expanse on the lower surface of the base plate so as to be able to keep a sufficient amount of grease in the central part of the base plate where heat is likely to accumulate, and it is therefore possible to obtain stable cooling performance.

According to the fourth invention, the groove is provided on the cooling fin side so as to be able to keep the amount of grease, and it is therefore possible to obtain stable cooling performance.

BRIEF DESCRIPTION OF THE DRAWINGS

FIG. 18 is a diagram illustrating a semiconductor device according to Embodiment 6 of the present invention.

FIG. 19 is a diagram illustrating a semiconductor device according to Embodiment 6 of the present invention.

DESCRIPTION OF EMBODIMENTS

Embodiment 1

Figure 1:
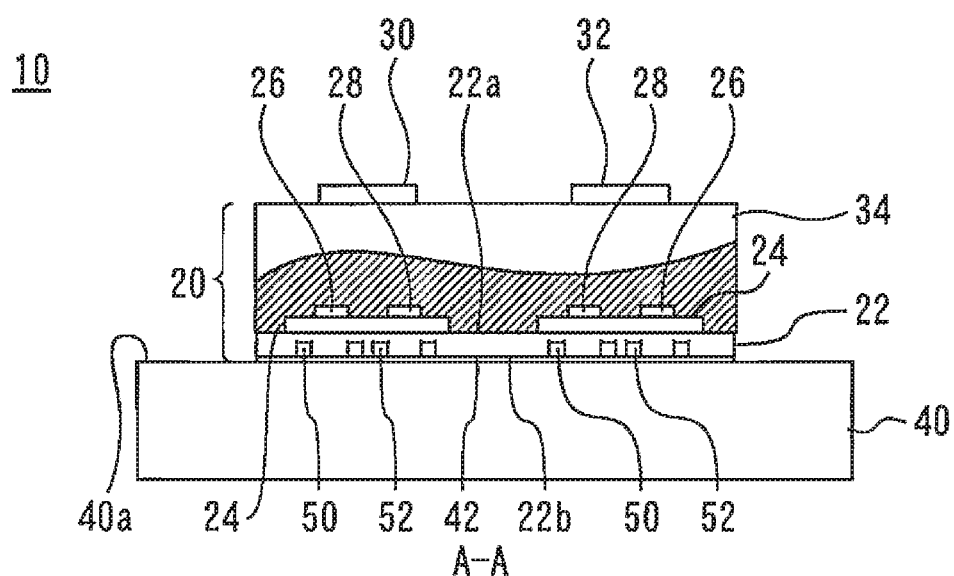
FIG. 1 is a diagram illustrating a semiconductor device according to Embodiment 1 of the present invention.
Figure 2:
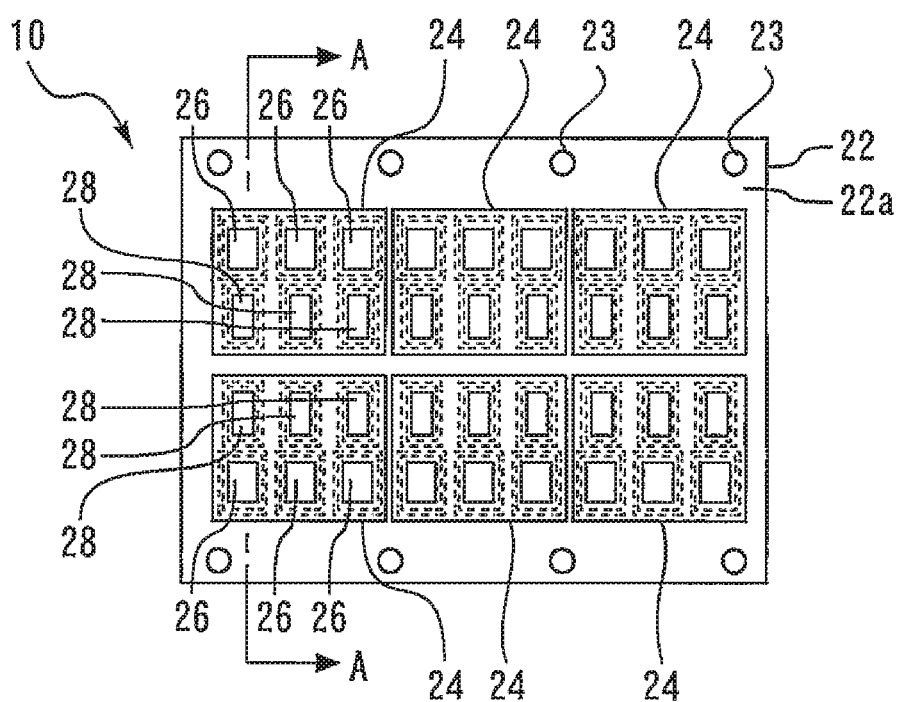
FIG. 2 is a diagram illustrating a semiconductor device according to Embodiment 1 of the present invention.

FIG. 1 to FIG. 5 are diagrams illustrating a semiconductor device according to Embodiment 1 of the present invention. FIG. 1 is a cross-sectional view along a line A-A in FIG. 2 and FIG. 2 is a chip arrangement diagram viewing an inside of a semiconductor device 10 from an upper surface side. The semiconductor device 10 according to Embodiment 1 is provided with a metallic base plate 22 provided with an upper surface 22a and a lower surface 22b, a plurality of insulating substrates 24 provided on the upper surface 22a and a plurality of semiconductor elements 26 and 28 which are mounted side by side on the respective insulating substrates 24 and which generate heat when power is turned on. The semiconductor element 26 is typically an IGBT and the semiconductor element 28 is a freewheel diode.

A case 34 covers the upper surface 22a side of the base plate 22 and electrodes 30 and 32 are exposed outside the case 34. Annular grooves 50 and 52 for storing insulating grease are provided on the lower surface 22b of the base plate 22. A surface 40a of a metallic cooling fin 40 is superimposed on the lower surface 22b with thermal conductive insulating grease 42 interposed therebetween, and the insides of the annular grooves 50 and 52 are filled with the insulating grease 42. Note that the base plate 22 is provided with a plurality of fixing holes 23 further on a perimeter side of the annular grooves 50 and 52. The base plate 22 and the cooling fin 40 are connected together by passing screws which are not shown through the fixing holes 23.

FIG. 3(a) is a top view of a periphery of one insulating substrate 24 shown in FIG. 2 seen from the upper surface 22a side of the base plate 22. FIG. 3(b) is a bottom view of FIG. 3(a) seen from the lower surface 22b side of the base plate 22. The plurality of annular grooves 50 and 52 separately surrounding the plurality of semiconductor elements 26 and 28 on the upper surface 22a side in a plan view of the base plate 22 are provided on the lower surface 22b. FIG. 3(c) is an enlarged cross-sectional view along a line B-B in FIG. 3(a). The annular groove 50 has a rectangular cross-sectional shape provided with a base portion 50a and side face portions 50b.

Figure 3:
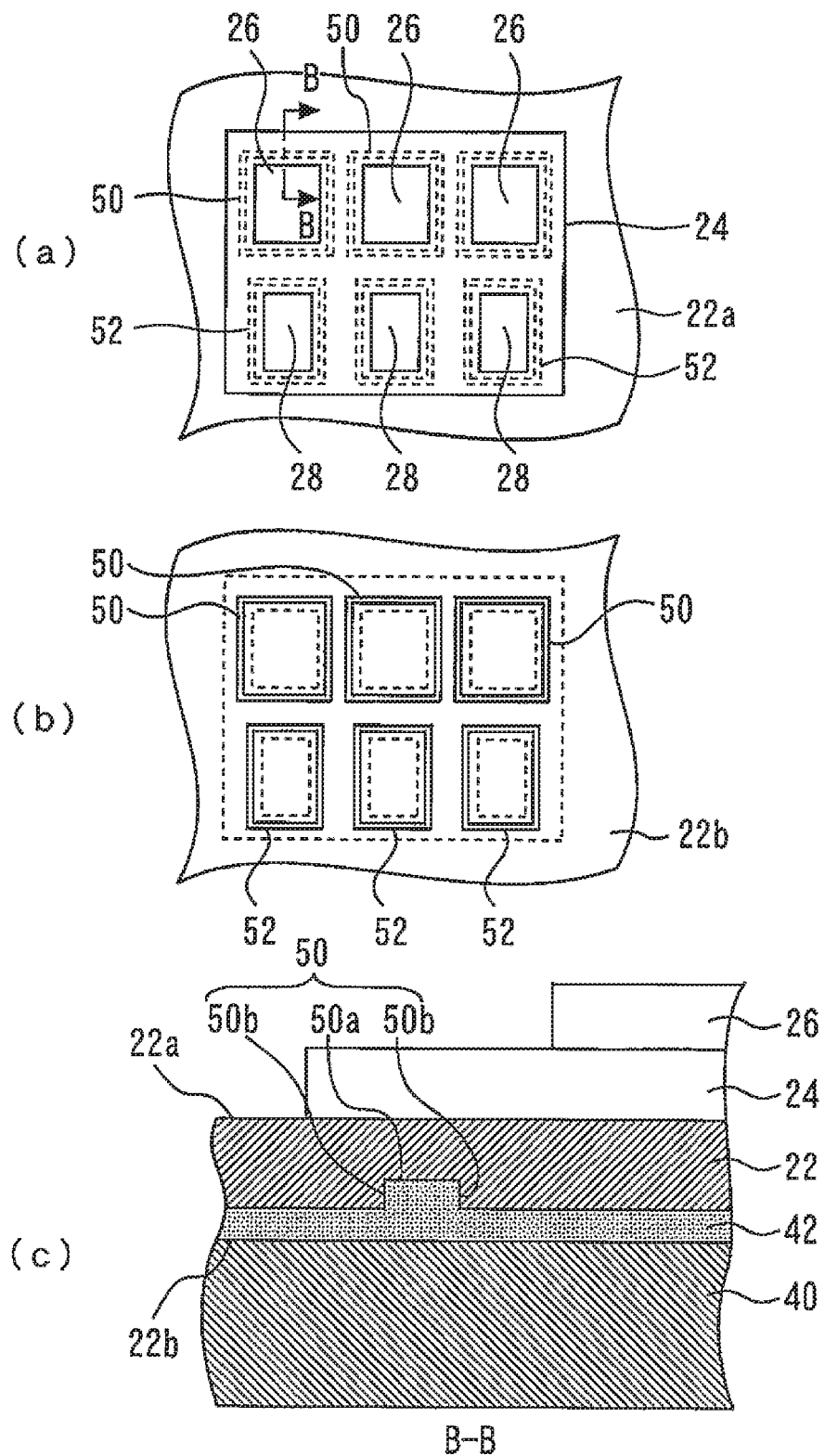
FIG. 3 is a diagram illustrating a semiconductor device according to Embodiment 1 of the present invention.
Figure 4:
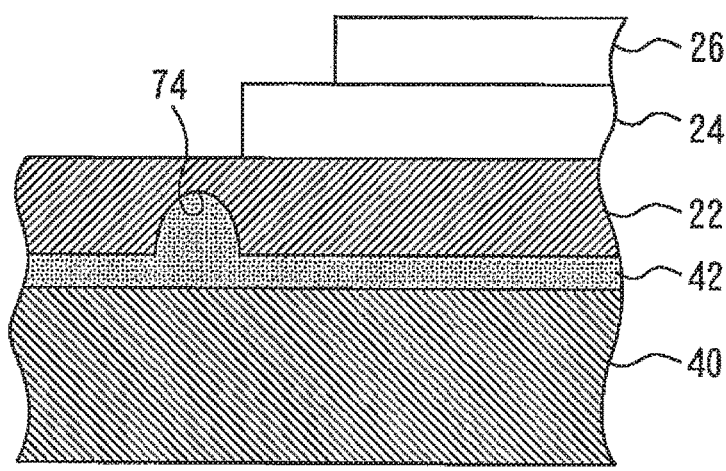
FIG. 4 is a diagram illustrating a semiconductor device according to Embodiment 1 of the present invention.
Figure 5:
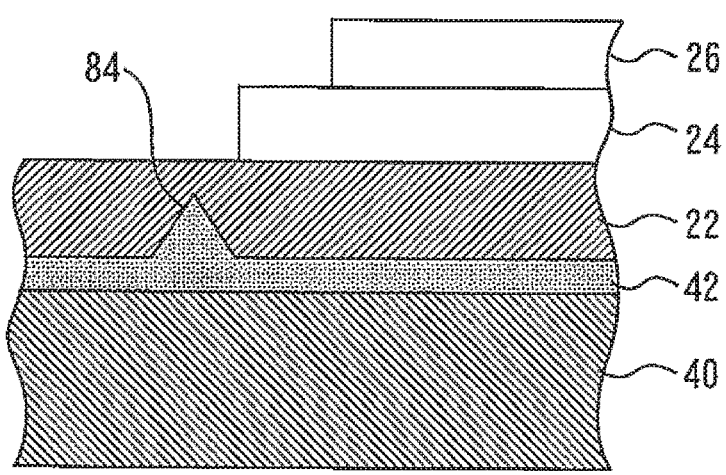
FIG. 5 is a diagram illustrating a semiconductor device according to Embodiment 1 of the present invention.

When a temperature of the base plate 22 increases while power to the semiconductor elements 26 and 28 is on, the metallic base plate 22 thermally expands. In this case, the insulating grease 42 sticks out of the insides of the annular grooves 50 and 52 and the amount of the insulating grease 42 between the base plate 22 and the cooling fin 40 is kept constant. On the other hand, when power is turned off and the temperature of the base plate 22 decreases, the insulating grease 42 returns to the annular grooves 50 and 52 as the base plate 22 contracts. Alternating heat generation and cooling causes discharging and storage of the insulating grease 42 to be repeated. It is thereby possible to keep constant the amount of the insulating grease 42 between the base plate 22 and the cooling fin 40 below the respective semiconductor elements 26 and 28. As a result, even when thermal expansion and contraction are repeated due to use over a long period of time, it is possible to prevent deterioration of cooling performance caused by an overflow of the insulating grease 42. Since the semiconductor elements 26 and 28 are respectively provided with the annular grooves 50 and 52 separately, it is possible to reliably keep an appropriate amount of the insulating grease 42 below the semiconductor elements 26 and 28 respectively. Note that the cross-sectional shape of the annular grooves 50 and 52 is not limited to that in FIG. 3(c). As shown in FIG. 4, an annular groove 74 having an ellipsoidal cross section may also be used. Furthermore, as shown in FIG. 5, an annular groove 84 having an isosceles triangular cross section may also be used. Note that instead of the plurality of annular grooves 50, grid-like grooves continuously extending so as to partition the plurality of semiconductor elements 26 and 28 into separate pieces in a plan view of the base plate 22 may also be provided on the lower surface 22b.

Embodiment 2

Figure 6:
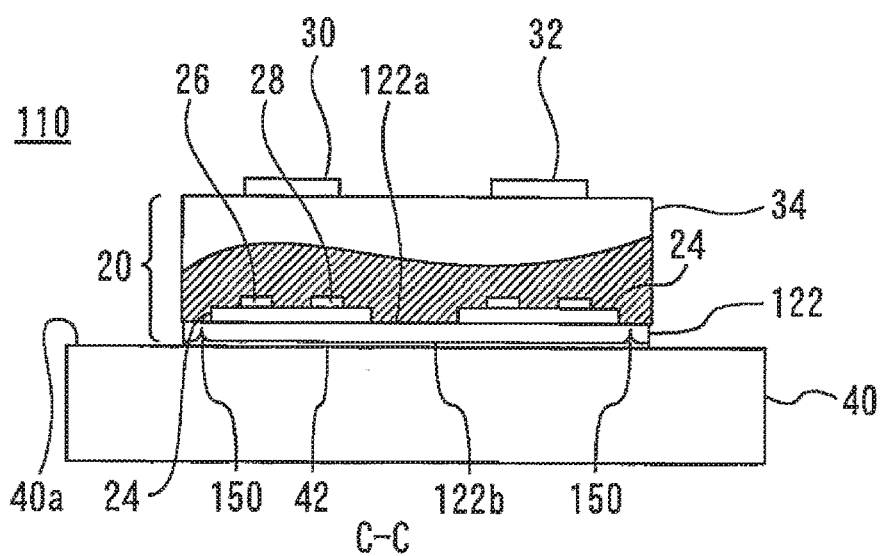
FIG. 6 is a diagram illustrating a semiconductor device according to Embodiment 2 of the present invention.
Figure 7:
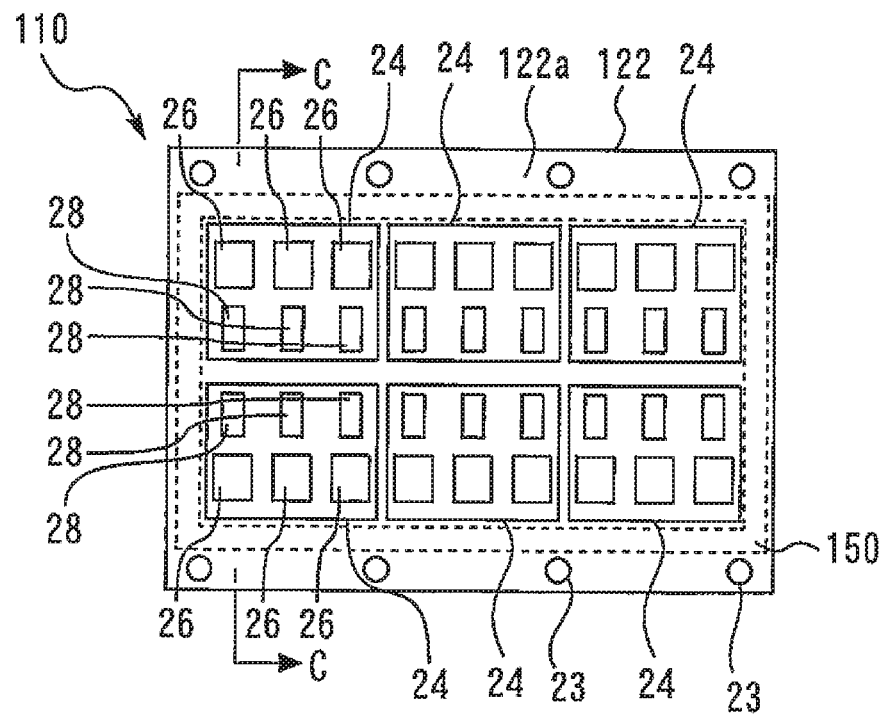
FIG. 7 is a diagram illustrating a semiconductor device according to Embodiment 2 of the present invention.

FIG. 6 to FIG. 11 are diagrams illustrating a semiconductor device 110 according to Embodiment 2 of the present invention. FIG. 6 is a cross-sectional view along a line C-C in FIG. 7. The semiconductor device 110 is the same as the semiconductor device 10 except in that it is provided with a base plate 122 instead of the base plate 22. FIG. 7 is a chip arrangement diagram seen from an upper surface 122a side of the base plate 122. An area shown by broken lines in FIG. 7 is an annular groove 150 provided on a lower surface 122b. The annular groove 150 is one continuous annular groove surrounding the semiconductor elements 26 and 28, and the insulating substrate 24 on the upper surface side in a plan view of the base plate 122. The inside of the annular groove 150 is filled with the insulating grease 42.

Figure 8:
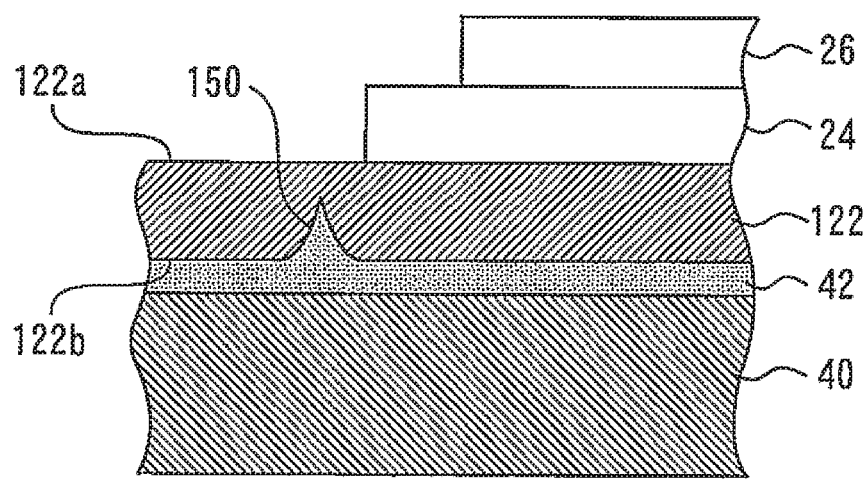
FIG. 8 is a diagram illustrating a semiconductor device according to Embodiment 2 of the present invention.

FIG. 8 illustrates a cross-sectional shape of the annular groove 150. The annular groove 150 includes two sides, a distance of which increases toward the lower surface 122*b* side, the two sides forming curves which are convex toward the inside of the annular groove 150. Although as the base plate 122 thermally expands, the width of the annular groove 150 also expands, since areas close to the distal end on the upper surface 122*a* side of the annular groove 150 abruptly becomes thinner, a clearance in the vicinity of the distal end expands less. For this reason, the effect of pushing out the insulating grease 42 during thermal expansion of the base plate 122 is much higher.

Figure 9:
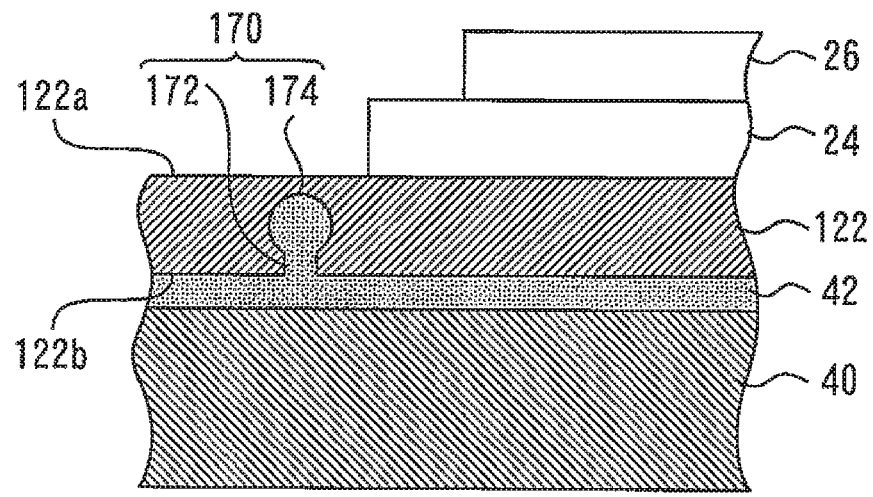
FIG. 9 is a diagram illustrating a semiconductor device according to Embodiment 2 of the present invention.
Figure 10:
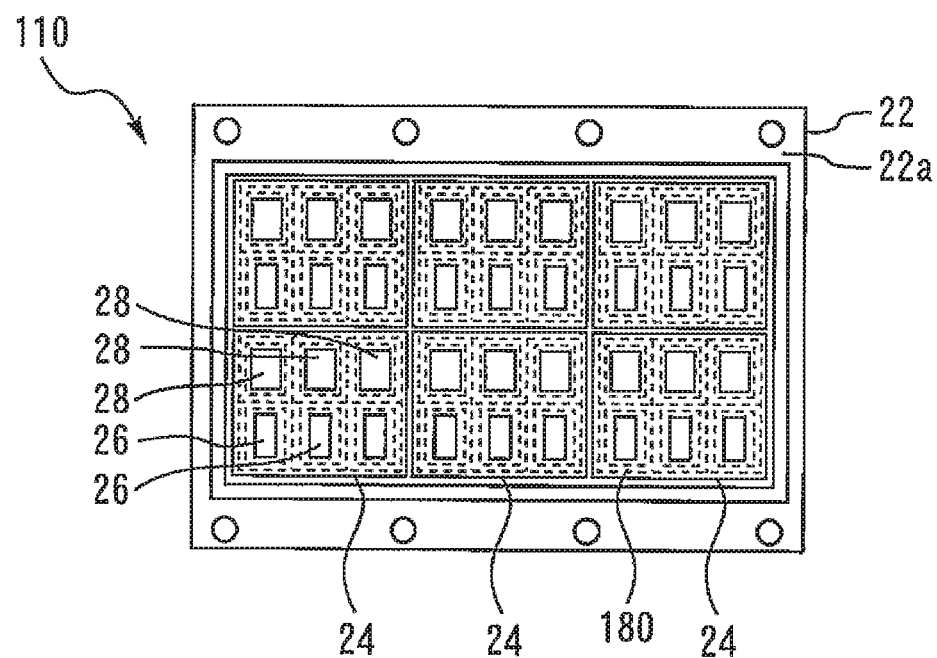
FIG. 10 is a diagram illustrating a semiconductor device according to Embodiment 2 of the present invention.
Figure 11:
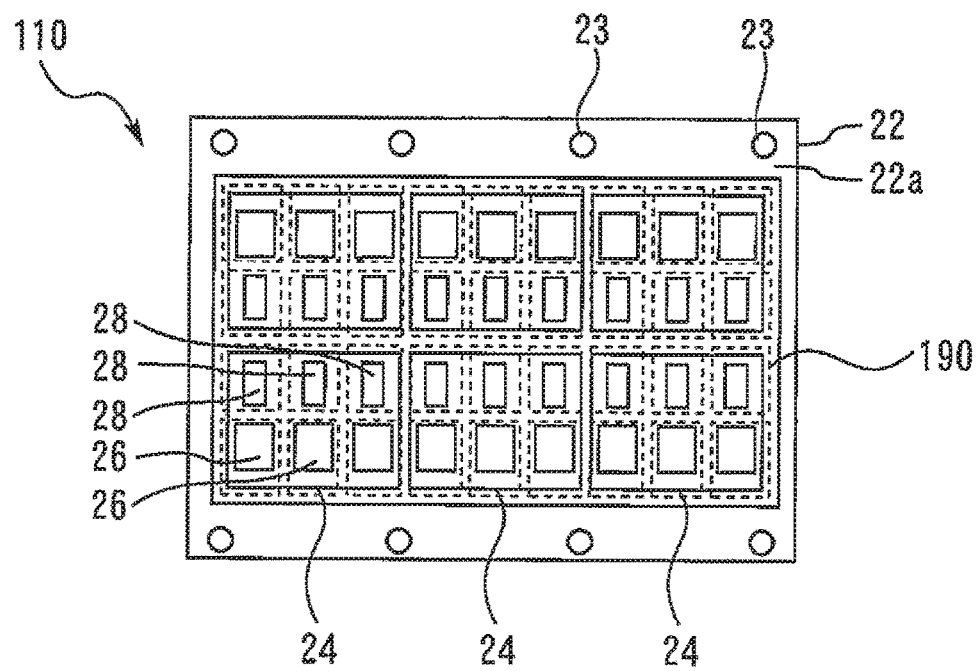
FIG. 11 is a diagram illustrating a semiconductor device according to Embodiment 2 of the present invention.

Instead of the annular groove 150, an annular groove 170 having a cross-sectional shape shown in FIG. 9 may also be used. The annular groove 170 is provided with a first portion 172 and a second portion 174. The first portion 172 is opened toward the lower surface 122*b* side at a width W1. The second portion 174 is connected to the first portion 172, located closer to the upper surface 122*a* side than the first portion 172, and has a greater width W2 than the width W1. Particularly in the present embodiment, the second portion 174 has an arc-shaped contour. The second portion 174 is designed to secure a wide space so as to be able to store a large volume of the insulating grease 42. The pattern of the annular groove 150 in a plan view of the base plate 122 may be modified as shown in FIG. 10 or FIG. 11. For example, as shown in FIG. 10, a plurality of annular grooves 180 surrounding the plurality of semiconductor elements 26 and 28 separately may also be provided as in the case of Embodiment 1. On the other hand, as shown in FIG. 11, grid-like grooves 190 continuously extending may also be used so as to partition the plurality of semiconductor elements 26 and 28 into separate pieces. The partition cell size of the annular grooves 190 may be increased so as to form grid-like grooves extending so as to partition the six insulating substrates 24. This makes it possible to stably secure the amount of the insulating grease 42 for each of the insulating substrates 24.

Embodiment 3

Figure 12:
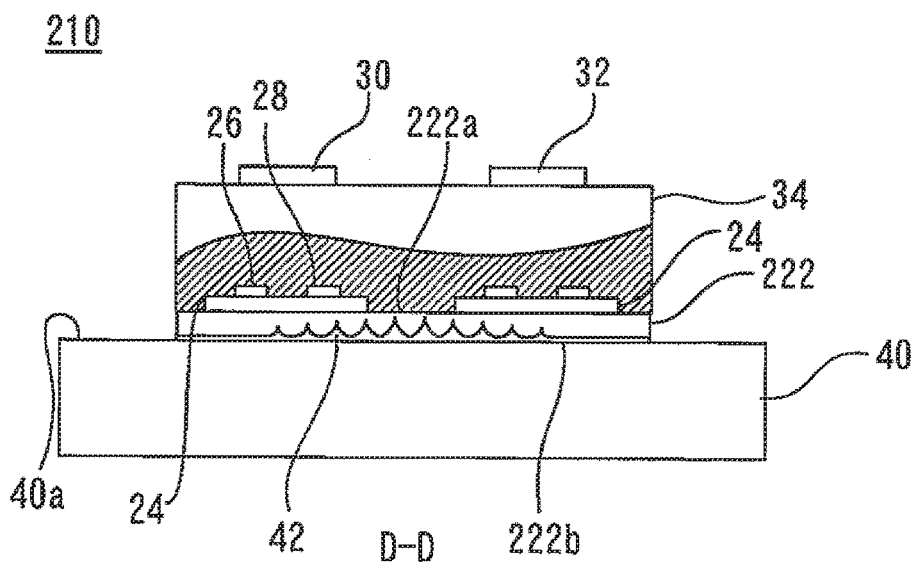
FIG. 12 is a diagram illustrating a semiconductor device according to Embodiment 3 of the present invention.
Figure 13:
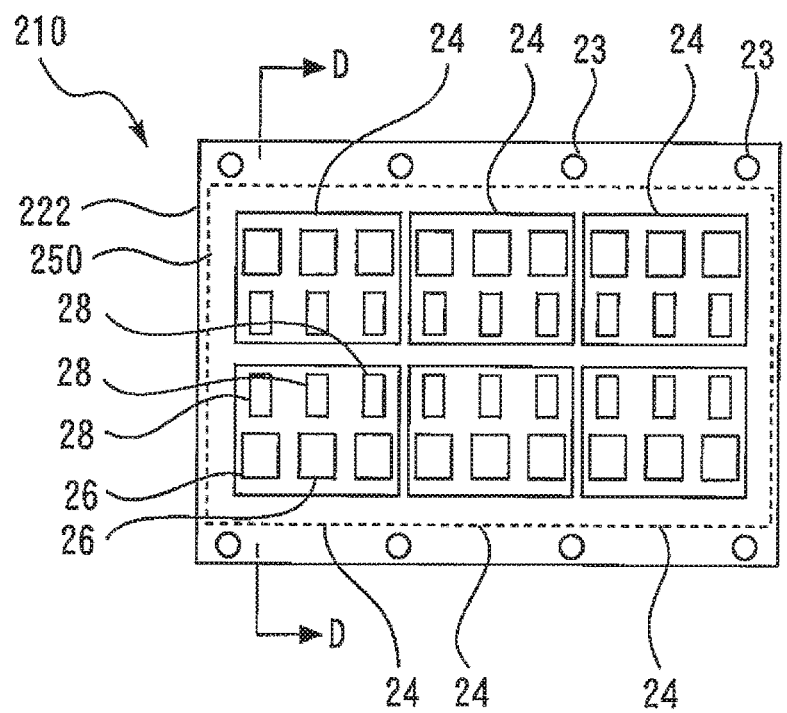
FIG. 13 is a diagram illustrating a semiconductor device according to Embodiment 3 of the present invention.
Figure 14:
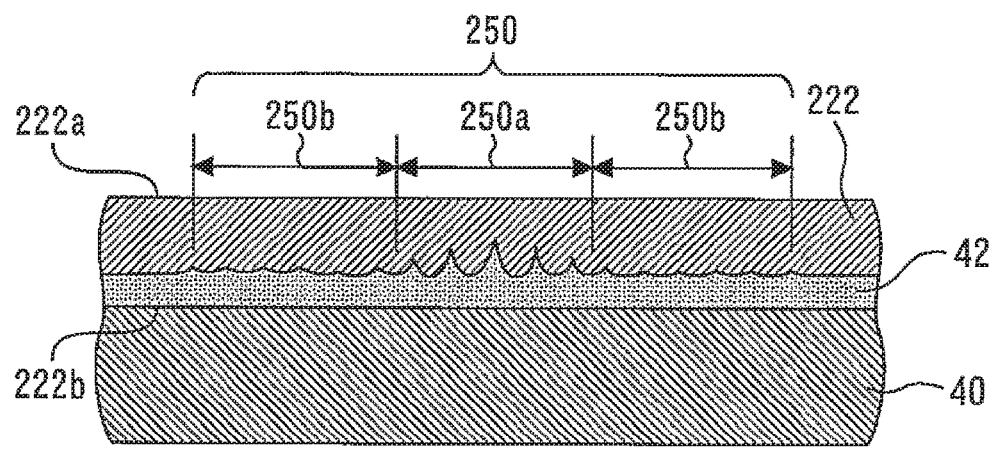
FIG. 14 is a diagram illustrating a semiconductor device according to Embodiment 3 of the present invention.

FIG. 12 to FIG. 14 are diagrams illustrating a semiconductor device 210 according to Embodiment 3 of the present invention. FIG. 12 is a cross-sectional view along a line D-D in FIG. 13. The semiconductor device 210 is the same as the semiconductor device 10 except in that it is provided with a base plate 222 instead of the base plate 22. FIG. 14 is an enlarged cross-sectional view of a groove region 250. The groove region 250 made up of a plurality of grooves connected to each other in a surface direction thereof is provided on a lower surface 222*b* of the base plate 222.

The groove region 250 is divided into a groove region 250*a* at the center of the base plate 222 and groove regions 250*b* on distal end sides of the base plate 222. Grooves of the groove region 250*a* are deeper than grooves of the groove regions 250*b*. Particularly in the present embodiment, the depth of the grooves of the groove region 250*a* increases as the distance from the center of the base plate 222 decreases. Since the inside of the groove region 250 is filled with the insulating grease 42, the insulating grease 42 can be stored or discharged in the entire lower surface 222*b* of the base plate 222 as described in Embodiments 1 and 2, and it is possible to keep constant the amount of the insulating grease 42 between the base plate 222 and the cooling fin 40. Since the deep groove region 250*a* is provided in the central part of the base plate 222 in which heat is most likely to accumulate, it is possible to keep a sufficient amount of charged insulating grease 42 in the central part.

Note that as shown in FIG. 14, the cross-sectional shape of each groove of the groove region 250 is the same as the cross-sectional shape of the annular groove 150 shown in FIG. 8 and depths are different between the groove regions 250*a* and 250*b*. However, the present invention is not limited to this, and the cross-sectional shape of one groove of the groove region 250 may be rectangular as shown in FIG. 3 or may be ellipsoidal as shown in FIG. 4 or may be isosceles triangular as shown in FIG. 5, and what is required is to make grooves deeper in the center of the base plate 222 and shallower on the distal end sides of the base plate 222.

Embodiment 4

Figure 15:
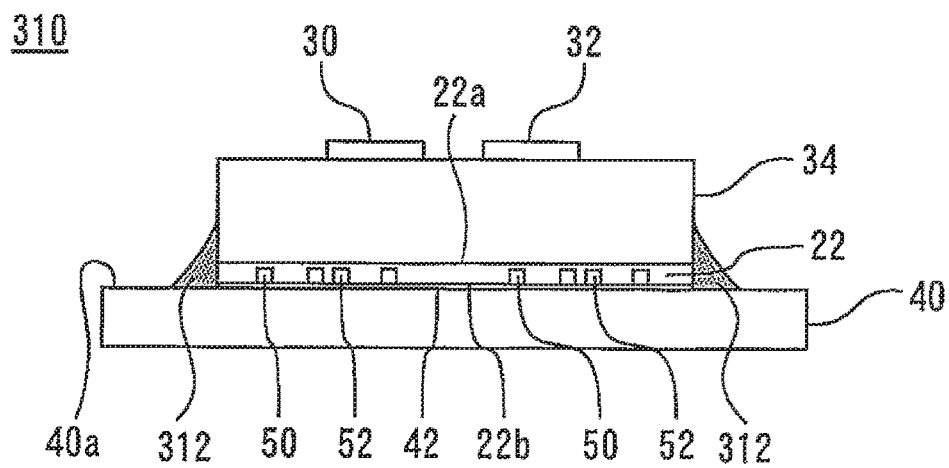
FIG. 15 is a diagram illustrating a semiconductor device according to Embodiment 4 of the present invention.

FIG. 15 is a diagram illustrating a semiconductor device 310 according to Embodiment 4 of the present invention. The semiconductor device 310 is the same as the semiconductor device 10 except in that a sealing member 312 is provided. The sealing member 312 is provided so as to seal the insulating grease 42 along edges of the base plate 22. This prevents the insulating grease 42 from sticking out in the surface direction of the base plate 22, making it possible to reduce a shortage of the amount of insulating grease. Note that the sealing member 312 may be combined with the semiconductor devices 110 and 210 according to Embodiments 2 and 3.

Embodiment 5

Figure 16:
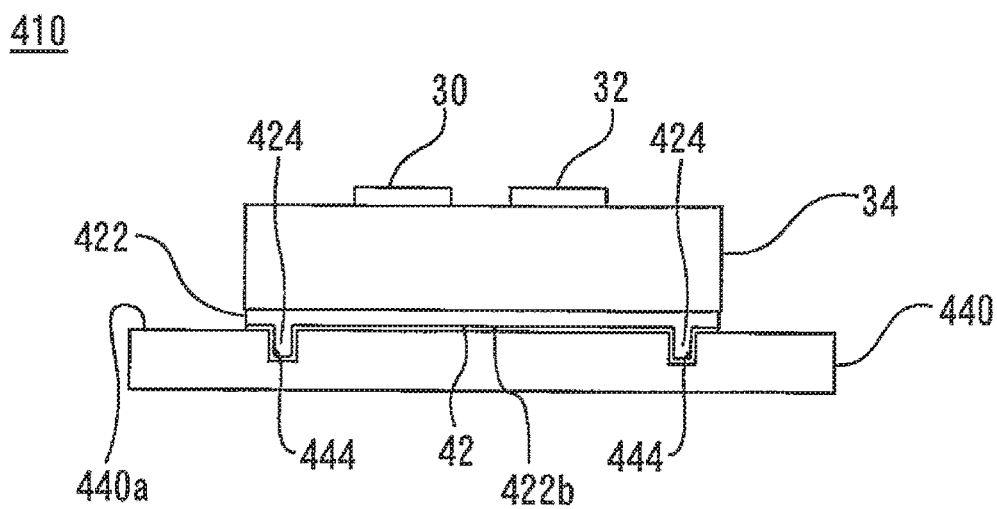
FIG. 16 is a diagram illustrating a semiconductor device according to Embodiment 5 of the present invention.
Figure 17:
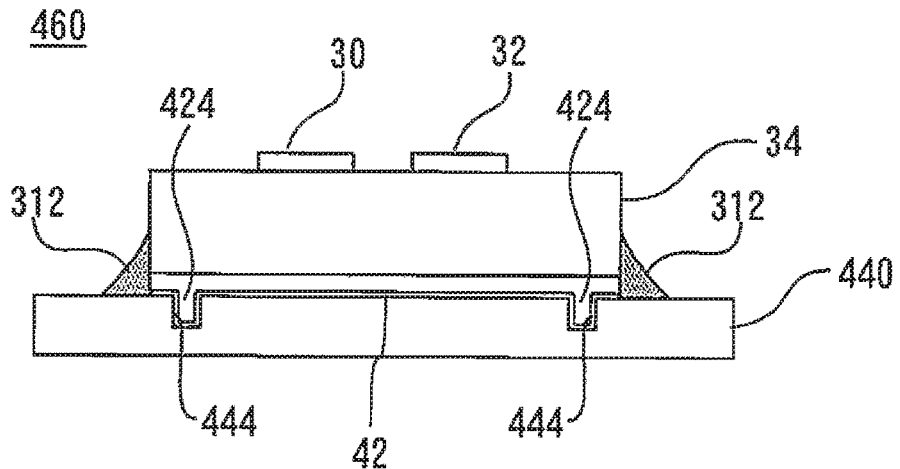
FIG. 17 is a diagram illustrating a semiconductor device according to Embodiment 5 of the present invention.

FIG. 16 and FIG. 17 are diagrams illustrating semiconductor devices 410 and 460 according to Embodiment 5 of the present invention. In a cooling fin 440 provided for the semiconductor device 410, annular grooves 444 having a smaller outline than the base plate 422 in a plan view is provided on a plane 440*a* which overlaps with the base plate 422 with the insulating grease 42 interposed therebetween. Furthermore, the base plate 422 is provided with convex portions 424 that engage with the annular grooves 444 on a lower surface 422*b* thereof. The convex portions 424 engaged with the grooves 444 can prevent the insulating grease 42 from sticking out in the surface direction of the base plate 422 causing a shortage of the amount of insulating grease. As shown in FIG. 17, it is also possible to provide the semiconductor device 460 combined with the sealing member 312 in Embodiment 4. Note that though not shown, the cooling fin 40 may be provided with one or a plurality of convex portions that engage with the annular grooves 50 to 190 on the lower surface of the base plates 22 and 122 according to Embodiments 1 and 2.

Embodiment 6

FIGS. 18 to 19 are diagrams illustrating semiconductor devices 510 and 560 according to Embodiment 6 of the present invention. The semiconductor device 510 is a combination of a base plate 322 provided with an upper surface 322*a* and a lower surface 322*b* and a cooling fin 540 provided with grooves 544 on a surface 540*a*. The lower surface 322*b* is flat. The shape of the groove 544 in a plan view of the base plate 322 is the same as the annular groove 150 in FIG. 7. An outline of the annular groove 544 is smaller than the base plate 322 in a plan view. The grooves 544 having the same function as those of the annular grooves 50 and 52 according to Embodiment 1 can prevent the insulating grease 42 from sticking out in the surface direction of the base plate 422 causing a shortage of the insulating grease. As shown in FIG. 19, the semiconductor device 560 may also be provided in which grooves 546 are further provided inside the grooves 544. Note that the base plate 322 may be replaced by any one of the base plates 22 to 222 according to Embodiments 1 to 3.

In the aforementioned embodiments, the semiconductor elements 26 and 28 may be semiconductor devices such as MOSFET, a semiconductor material of which is silicon carbide (SiC). Since the SiC semiconductor device is used at a higher temperature than a silicon device when power is on during normal drive, the rate of expansion and contraction of the base plate 22 is high. Thus, a merit of applying the aforementioned embodiments is high.

DESCRIPTION OF SYMBOLS

10 semiconductor device; 22 base plate; 22a upper surface; 22b lower surface; 24 insulating substrate; 26,28 semiconductor element; 30, 32 electrode; 34 case; 40 cooling fin; 40a surface; 42 insulating grease; 50,52 annular groove

The invention claimed is:

1. A semiconductor device comprising:
    a base plate having an upper surface and a lower surface; and
    a plurality of planar semiconductor elements provided side by side on the upper surface side,
    wherein the lower surface of the base plate is provided with a groove region where a plurality of grooves are continuously provided so as to spread and overlap with the plurality of semiconductor elements, grooves of the groove region in the center of the base plate are deeper than grooves of the groove region on distal end sides of the base plate.

2. The semiconductor device according to claim 1, further comprising a cooling fin having a flat surface, the flat surface being superimposed on the lower surface,
    wherein insulating grease is provided between the lower surface and the flat surface, and
    a sealing member is provided so as to seal the insulating grease along an edge of the base plate.

3. The semiconductor device according to claim 1, wherein a semiconductor material of the semiconductor element is silicon carbide.

* * * * *